United States Patent [19]

Ravas et al.

[11] Patent Number: 5,406,237

[45] Date of Patent: Apr. 11, 1995

[54] WIDEBAND FREQUENCY MULTIPLIER HAVING A SILICON CARBIDE VARACTOR FOR USE IN HIGH POWER MICROWAVE APPLICATIONS

[75] Inventors: Richard J. Ravas, Hempfield Township, Westmoreland County; Harvey C. Nathanson, Pittsburgh, both of Pa.; Marvin Cohn; Edward C. Niehenke, both of Baltimore, Md.

[73] Assignee: Westinghouse Electric Corporation, Pittsburgh, Pa.

[21] Appl. No.: 185,628

[22] Filed: Jan. 24, 1994

[51] Int. Cl.⁶ .................................................. H01P 1/20
[52] U.S. Cl. ......................................... 333/218; 257/77
[58] Field of Search ..................... 333/218; 263/77; 363/158

[56] References Cited

U.S. PATENT DOCUMENTS

| | | |
|---|---|---|
| 3,085,205 | 4/1963 | Sante . |
| 3,239,744 | 3/1966 | Ludwig et al. . |
| 3,263,154 | 7/1966 | Steele . |
| 3,267,352 | 8/1966 | Blight ................................. 333/218 |
| 3,268,795 | 8/1966 | Hudspeth et al. . |
| 3,287,621 | 11/1966 | Weaver ............................... 333/218 |
| 3,307,099 | 2/1967 | Weller et al. . |
| 3,320,516 | 5/1967 | Lee . |
| 3,328,670 | 6/1967 | Parker . |
| 3,341,714 | 9/1967 | Kach . |
| 3,343,069 | 9/1967 | Tsuda . |
| 3,348,125 | 10/1967 | Wieman . |
| 3,358,215 | 12/1967 | Swan . |
| 3,376,495 | 4/1968 | Leonard .............................. 333/218 |
| 3,378,690 | 4/1968 | Dodson . |
| 3,393,357 | 7/1968 | Adams et al. . |
| 3,395,330 | 7/1968 | Kurzl . |
| 3,397,369 | 8/1968 | Uhlir, Jr. . |
| 3,400,322 | 9/1968 | Habra . |
| 3,402,340 | 9/1968 | Ringereide .......................... 333/218 |
| 3,443,199 | 5/1969 | Collins et al. . |
| 3,513,403 | 5/1970 | Chang ................................. 330/4.9 |
| 3,534,244 | 10/1970 | Brownley ............................ 333/218 |
| 3,593,155 | 7/1971 | Lowe . |
| 3,631,331 | 12/1971 | Fairley . |
| 3,713,014 | 1/1973 | Wagner . |
| 3,829,333 | 8/1974 | Tohi et al. . |
| 3,993,962 | 11/1976 | Hopwood et al. ................... 331/18 |
| 4,074,214 | 2/1978 | Aichholzer ......................... 333/204 |
| 4,074,347 | 2/1978 | Hall .................................... 363/158 |
| 4,099,228 | 7/1978 | Cohn ................................... 363/159 |
| 4,152,680 | 5/1979 | Harrison ............................. 333/246 |
| 4,228,411 | 10/1980 | Harrison ............................. 333/218 |
| 4,360,867 | 11/1982 | Gonda ................................. 363/158 |
| 4,531,142 | 7/1985 | Weyrich et al. . |
| 4,754,236 | 6/1988 | Mamodaly et al. ......... 331/117 FE |
| 4,762,806 | 8/1988 | Suzuki et al. . |
| 4,918,497 | 4/1990 | Edmond . |
| 4,947,218 | 8/1990 | Edmond et al. . |
| 5,027,168 | 6/1991 | Edmond . |
| 5,061,972 | 10/1991 | Edmond . |
| 5,142,255 | 8/1992 | Chang et al. ....................... 333/204 |
| 5,319,220 | 6/1994 | Suzuki et al. ....................... 257/77 |

FOREIGN PATENT DOCUMENTS

210706 9/1987 Japan ................................. 333/218

OTHER PUBLICATIONS

Bhatnazar et al., *Silicon-Carbide High-Voltage (400V) Schattky Barrier Diodes*, IEEE Electron Device Letters, vol. 13, No. 10, Oct. 1992, pp. 501–503.

Primary Examiner—Paul Gensler

[57] ABSTRACT

The invention provides frequency multiplier circuitry which may be used in the output section of high power microwave systems to efficiently provide higher output frequencies. Generally, one multiplier stage may be utilized to double the frequency of the input signal with several stages being cascaded to achieve even higher frequencies. The varactor diodes utilized in circuits of the invention are preferably constructed primarily of silicon carbide, which has many advantages when compared with current varactors constructed of GaAs or silicon. Some presently preferred embodiments utilize a four terminal varactor bridge instead of a single varactor diode. The invention also teaches several significant techniques for improving the bandwidth of the circuitry, thus allowing variation of the frequency of the input signal without significantly attenuating the output signal.

12 Claims, 6 Drawing Sheets

WIDEBAND FREQUENCY MULTIPLIER HAVING A SILICON CARBIDE VARACTOR FOR USE IN HIGH POWER MICROWAVE APPLICATIONS

BACKGROUND OF THE INVENTION

1. Field of the Invention

The present invention relates to circuitry utilized to generate microwave signals at relatively high power levels. Particularly, the invention relates to frequency multiplier circuitry for increasing the output frequency of a power signal provided by an amplifier operated in the microwave range.

2. Description of the Prior Art

It is very difficult to directly generate relatively high power output signals at higher frequencies within the radio frequency (RF) range. As a result, parametric frequency multipliers are often connected to power sources generating the desired power levels at lower frequencies. Such frequency multipliers typically incorporate a varactor diode to multiply the lower frequency power signal to the higher frequency signal eventually required by the particular application.

Although a varactor diode is a diode, the process of frequency multiplication is not the result of rectification. Instead, frequency multiplication is accomplished by the voltage dependent nonlinear junction capacitance of a varactor diode. Because this property is reactive, it is possible to achieve high efficiencies.

A basic explanation of the frequency multiplication process is that an AC voltage causes the junction capacitance of the diode to vary nonlinearly throughout each cycle of the fundamental (or "pump") frequency. This is generally equivalent to periodically pulling apart the plates of a parallel plate capacitor in order to rhythmically change the capacitance. Whenever the capacitor plates have a voltage across them, the mechanical work involved in separating the plates is translated into increased electrical field energy. Similarly, relaxing the force results in translation of the stored electrical field energy back to mechanical energy. If, this "pumped" capacitor is placed in a location common to two resonant loops and the resonances of the loops are harmonically related, it is possible to transfer energy from one loop to the other and hence from one frequency to the other.

A persistent problem with frequency multiplier circuits has been that the varactor diodes themselves have presented a significant power limitation. The following factors have contributed to this power limitation: (1) the breakdown voltage of the diode; (2) the operating temperature limit of the diode; and (3) the efficiency of the diode. Varactor diodes utilized in the most demanding applications have typically been constructed of gallium arsenide (GaAs), which offers better operating characteristics when compared with a similar silicon (Si) diode. Even GaAs diodes, however, are generally limited to operation temperatures of less than 150° C. and have breakdown voltage limits of about 15-25 volts for efficient operation. Higher power diode equivalents can be produced by connecting several GaAs diodes in series. A string of four such diodes would typically achieve a breakdown voltage of 50-60 V. With diode strings, however, it is difficult to design a heat sink structure compatible with microwave "plumbing".

Another problem with many prior art frequency multiplier circuits has been a relatively narrow bandwidth. A narrow bandwidth is, of course, acceptable so long as the frequency of the RF input signal is invariant. Many modern applications, such as phased array radar systems, require operation across a range of frequencies. For maximum power output over the range, it is necessary that any power circuitry utilized in the system, including the frequency multiplier circuitry, be inherently wideband. Additionally, a relatively wide bandwidth in the theoretical circuit design facilitates tolerance of undesired component variances which inevitably appear in physical realizations.

SUMMARY OF THE INVENTION

The present invention provides frequency multiplier circuitry which has many advantages when compared with prior art frequency multipliers of similar dimensions. The circuitry operates to receive a relatively high power input signal produced by an appropriate electrical energy source, such as a power amplifier, and delivers an output signal at a selected harmonic of the input signal with high efficiency. This output signal may then be delivered to an appropriate electrical load. Generally, one multiplier stage may be utilized to double the frequency of the input signal with several stages being cascaded to achieve even higher frequencies. Varactor diodes utilized in the invention are preferably constructed primarily of silicon carbide. Among the advantages of silicon carbide are higher breakdown voltage, higher operating temperature and higher efficiency. Several significant techniques for improving the bandwidth of the circuitry are also taught by the invention. As a result, the frequency of the input signal can be varied somewhat without significantly attenuating the output signal.

Each frequency multiplier stage constructed in accordance with the invention includes an input filter. The input filter provides coupling between the electrical energy source and the varactor means at the fundamental frequency while decoupling the varactor means from the input at undesired harmonics. Similarly, an output filter is provided between the varactor means and the stage output to provide coupling at the output frequency while providing decoupling at the fundamental frequency and other harmonics. Because of the difficulty of realizing discrete components at the frequencies with which many embodiments of the invention will be used, the input filter and output filter are preferably constructed of microstrip tuning stubs or the like. The length of such tuning stubs is chosen to filter the undesired harmonics, while the characteristic impedance is preferably adjusted to cancel capacitive reactance imposed on the circuit by the varactor means.

Each frequency multiplier stage also includes bias means for maintaining appropriate reverse bias on the varactor means. If self bias operation is desired, the bias means includes one or more DC blocking capacitors. These blocking capacitors may preferably have a relatively high capacitance value so that they essentially present a short circuit at the frequencies of interest. Fixed bias may alternatively be provided by DC source means having the appropriate DC value.

Some presently preferred embodiments of the invention utilize a four terminal varactor bridge to provide the desired nonlinear voltage dependent capacitance. An advantage of this arrangement is the inherent cancellation of certain harmonics, thus simplifying the configuration of the input filter and output filter.

DETAILED DESCRIPTION OF PRESENTLY PREFERRED EMBODIMENTS

Figure 1:
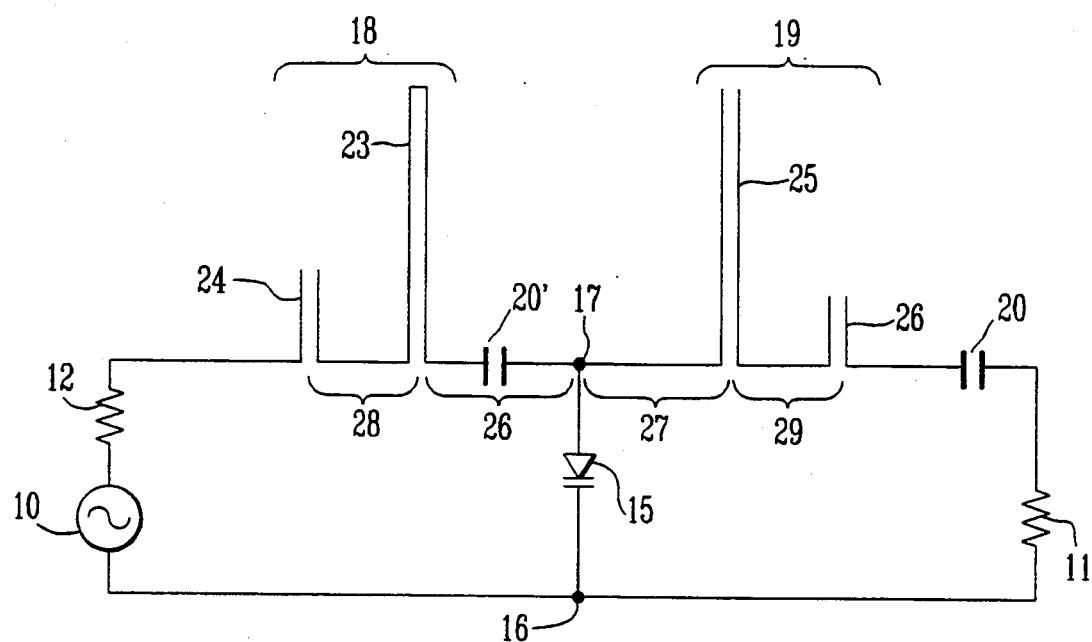
FIG. 1 is a schematic diagram of a presently preferred embodiment of the frequency multiplier circuit of the invention utilizing a single varactor diode and connected interposing an electrical energy source and an electrical load.

FIG. 1 schematically illustrates a frequency multiplier circuit constructed in accordance with the invention. The circuit receives power from source 10 at fundamental frequency and delivers power to load 11 at a selected harmonic of the fundamental frequency with relatively high efficiency. Source 10, which includes source impedance represented by resistor 12, may typically be a relatively high frequency power amplifier of the type utilized in radar or other microwave systems. In such applications, load 11 would generally include a wave guide or antenna element for transmitting the microwave energy. Because source 10 operates at a lower frequency than the energy delivered to load 11, the design and construction of source 10 are simplified.

The "heart" of the frequency multiplier circuit is varactor diode 15. Varactor diode 15 has a capacitance which decreases nonlinearly as the applied voltage increases. As a result, a voltage waveform is produced across terminals 16 and 17 which contains the fundamental frequency as well as various harmonics thereof. Input filter 18 couples source 10 to varactor 15 at the fundamental frequency while providing decoupling at undesired harmonics. Similarly, output filter 19 couples varactor 15 to load 11 at the desired output harmonic while providing decoupling at the fundamental and other harmonic frequencies.

DC voltage necessary to maintain the reverse bias condition across varactor diode 15 may either be self-generated or provided by fixed bias circuitry. In the circuit of FIG. 1, self-generated bias is provided by DC blocking capacitors 20 and 20'. When operation of the frequency multiplier circuit is initiated, capacitors 20 and 20' quickly charge to the required bias level during the positive half cycles of the applied voltage, when the diode will conduct. When this bias level is achieved, varactor diode 15 will no longer conduct because positive levels will not be reached.

At the relatively high frequencies at which the frequency multiplier circuit of FIG. 1 will typically be operated, lumped inductors are generally unrealizable. Thus, the reactive circuit components of input filter 18 and output filter 19 are preferably transmission line stubs. In this case, input filter 18 includes tuning stubs 23 and 24. Similarly, output filter 19 contains stubs 25 and 26.

Tuning stubs 23 and 25 each have an electrical length approximately equal to one-quarter the wavelength of the fundamental frequency. Thus, short stub 23 acts as an open circuit at the fundamental frequency and a short circuit at the second harmonic. Similarly, the open stub 25 acts as a short circuit at the fundamental frequency and an open circuit at the second harmonic, which in this exemplar is the selected harmonic to be delivered to load 11. It can therefore be seen that stubs 23 and 25 insure proper routing of the two major frequency components. The lengths of lines 26 and 27 are approximately a quarter wavelength at the second harmonic and the fundamental frequency respectively. The lengths and characteristic impedance may be adjusted to couple and match the diode to the fundamental and second harmonic frequencies.

Stubs 23 and 25, however, do not provide blocking of all undesired frequency components which may appear across varactor diode 15. For example, stub 23 provides an open circuit at the third harmonic. This may be blocked by smaller open stub 24, which has an electrical length equal to one-quarter the wavelength of the third harmonic. Similarly, output filter 19 may include open stub 26 having an electrical length equal to one-quarter the wavelength of the fourth harmonic to block components at that frequency. Unfortunately, it is practically impossible to achieve the ideal of isolating varactor diode 15 from source 10 and load 11 at all other frequencies. These higher order harmonics will produce some power loss within the overall system, but such power loss is relatively insignificant in comparison with the added complexity of additional tuning stubs within filters 18 and 19. Spacings 28 and 29 are selected to optimize the impedance match of the diode.

Figure 2:
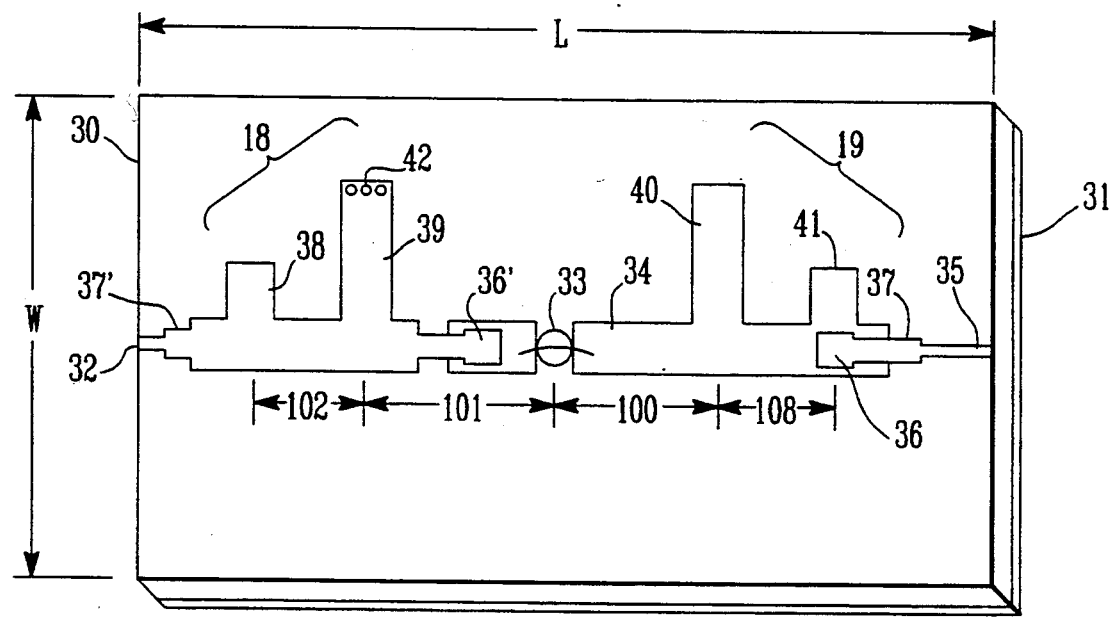
FIG. 2 is a diagrammatic representation of a frequency multiplier circuit similar to that shown in FIG. 1 as it may appear constructed in microstrip format.

FIG. 2 illustrates a frequency multiplier circuit similar to that in FIG. 1 as it may actually appear in microstrip format. The circuit is constructed on a semiconductor or dielectric substrate 30 having a metallized ground plane 31 on its reverse side. In this case, substrate 30 is in the form of a rectangle having dimensions L by W. A typical value for the dimension L may be two centimeters, with W being one centimeter or less. The circuit includes an input line 32 which is electrically connected to a small varactor 33. A short segment 34 of microstrip is also connected to varactor diode 33. Segment 34 is connected to output line 35 via capacitor 36 and an impedance matching transformer 37. Transformer 37 functions to transform the lower impedance of varactor diode 33 to the typically higher impedance required by the load. Input transformer 37' completes the match at fundamental input frequency. Tuning stubs 38 and 39 correspond to tuning stubs 24 and 23 of FIG. 1, respectively. Similarly, tuning stubs 40 and 41 respectively correspond to stubs 25 and 26. Stub 39 is shorted at its ends by grounding vias, such as grounding via 42, which are small conductive posts passing through substrate 30 to ground plane 31. The diode may be matched at the fundamental frequency by selecting the characteristic impedance and length of line 100. Similarly, the second harmonic may be partially matched by adjusting the length and characteristic impedance of line 101. Additionally, the lengths of lines 102 and 108 can also be adjusted to improve the impedance match.

In accordance with the invention, the varactor diodes which are utilized in the disclosed frequency multiplier circuit are preferably constructed primarily of silicon carbide (SiC). The use of silicon carbide as a substrate material for constructing varactor diodes has heretofore been unappreciated. Such a device, however, would have a breakdown voltage many times higher and would be able to withstand significantly greater operating temperatures than a GaAs or Si varactor diode of similar dimensions. As a result, frequency multiplier circuits can be provided of reasonable size and cost which can operate at greater power levels. The high breakdown voltage of SiC also provides a large diode capacitance variation over the applied voltage range. The large capacitance swing is important for efficient multiplication as will be discussed below. Additionally, since the power per unit area for a SiC varactor diode is relatively high, junction area can be made smaller than equivalent varactor diodes constructed of other materials. The result is a higher operating impedance (smaller average capacitance) for an equivalent power level. This results in the SiC varactor diode having a higher impedance. This higher impedance facilitates impedance matching to higher impedance external circuit components as well as providing a higher cutoff frequency.

In order to appreciate the advantages of SiC varactor diodes over either GaAs or Si varactor diodes, it is necessary to examine some of the mathematical relations governing varactor diode performance. Specifically, the maximum power rating, Johnson-Deloach limit, and varactor cutoff frequency will be reviewed.

a. Derivation Of Maximum Power Rating

One fundamental figure of merit of a varactor diode is its maximum power rating, which is determined by the following equation:

Average capacitance, $C_{av}$, is determined by:

$$C_{av} = \frac{\epsilon_{SiC}\pi R_o^2}{(W_0/2)} \quad (1)$$

where:
$\epsilon_{SiC}$ is the permittivity of SiC;
$R_o$ is the junction radius; and
$W_o$ is the maximum depletion layer thickness.
Now, $V_{RMS}$ is determined by:

$$V_{RMS} = \frac{V_{MAX}}{2\sqrt{2}} \quad (2)$$

where:

$$V_{MAX} = \tfrac{1}{2}E_{crit}W_o \quad (3)$$

$E_{crit}$ is the breakdown field of SiC. Maximum power rating, $P_{MAX}$, is determined by:

$$P_{MAX} = \tfrac{1}{2} C_{av} V_{RMS}^2 f_{op} \quad (4)$$

where:
$f_{op}$ is the desired fundamental frequency. Substituting equations (1), (2) and (3) into equation (4) gives:

$$P_{MAX} = 1/32[\epsilon_{SiC}A\, E_{crit}^2 W_o f_{op}] \quad (5)$$

where:

$$A = \pi R_o^2.$$

b. Determining the Johnson-Deloach Limit

The maximum operating frequency, $f_{MAX}$, is determined by:

$$f_{MAX} = \frac{V_{sat}}{2\pi\omega_o} \quad (6)$$

where:
$v_{sat}$ is the saturation velocity. Maximum impedance, $Z_{MAX}$, of the varactor diode, can be determined by:

$$Z_{MAX} = 1/(2\pi f_{MAX} C_{min}) \quad (7)$$

where $C_{min}$, the minimum capacitance of the diode, is given by:

$$C_{min} = \frac{\epsilon_{SiC}A}{W_o} \quad (8)$$

The Johnson-Deloach limit can be determined from equations (6), (7) and (8) as follows:

$$P_{MAX}f_{MAX}Z_{MAX} = \frac{1}{(16\pi)^2}(E_{crit}v_{sat})^2 \quad (9)$$

Examining the Johnson-Deloach limit, equation (9), reveals the advantage of SiC varactor diodes when compared with similar diodes constructed GaAs or Si. The value of the saturation velocity, $v_{SAT}$, for SiC is approximately equal that for GaAs (approximately $2.0 \times 10^7$ cm/sec). On the other hand, the value of the critical voltage breakdown field, $E_{CRIT}$, for SiC is approximately ten (10) times that for GaAs or Si ($2.0 \times 10^6$ V/cm for SiC). As a result, the Johnson-Deloach limit for a SiC varactor diode is a factor of one hundred (100) or better than that for a similar GaAs diode.

c. Thermal Characteristics

An important consideration in the use of a varactor diode in a high power frequency multiplier circuit is the ability to remain at a safe operating temperature. This has been one of the significant limiting factors in the use of varactor diodes constructed of Si or GaAs. The thermal spreading impedance, $Z_{TS}$, of a semiconductor device is determined by:

$$Z_{TS} = \frac{1}{4\sigma_T R_o} \; °C./Watt \quad (10)$$

where:
$\sigma_T$ is thermal conductivity. The significance of this equation can be shown by inserting some values for the parameters $\sigma_T$ and $R_o$. For GaAs, $\sigma$ is only about 0.8 W/cm°C. as opposed to 3-4 W/cm°C. for SiC. Now consider how this impacts the power dissipation rating of the varactor diode.

$$\Delta T = P_{MAX} Z_{TS} °C. \qquad (11)$$

Since SiC devices can operate at junction temperatures approaching 500° C. while GaAs devices are limited to 150° C. to 200° C., the SiC device has a significant advantage. In addition to the internal thermal properties of the SiC varactor diode, its higher operating temperature reduces external heat sink requirements thus providing another advantage.

d. Varactor Cutoff Frequency

Varactor diodes have inherent characteristics which give rise to a roll off in frequency response beginning at the cutoff frequency, $f_{co}$. Two parameters of significance in this determination are the voltage dependent junction capacitance, C, and the spreading resistance, $R_{sp}$.

The spreading resistance, $R_{sp}$, is given by:

$$R_{sp} = \frac{\xi_{SiC}}{4R_o} \text{ ohms} \qquad (12)$$

where:

$\xi_{SiC}$ is the resistivity of SiC. From equation (8):

$$C_{min} = \frac{\epsilon_{SiC} A}{W_o} \qquad (13)$$

The cutoff frequency, $f_{co}$, is given by:

$$f_{co} = \frac{1}{2\pi R_{sp} C_{min}} \qquad (14)$$

Substituting equations (12) and (13) into equation (14) gives:

$$f_{co} = \left[ \frac{2}{\pi^2 \xi_{SiC} \epsilon_{SiC}} \right] \left[ \frac{W_o}{R_o} \right] \qquad (15)$$

Figure 3:
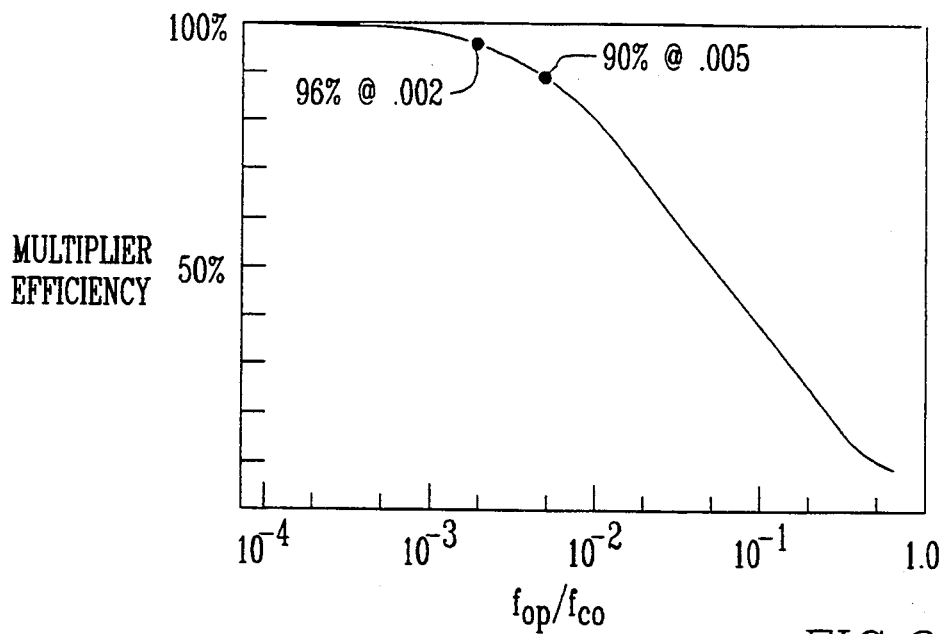
FIG. 3 is a plot of the efficiency of a frequency multiplier circuit versus the ratio of operating frequency to cut-off frequency.

Notice that in equation (15), the term $R_o$ appears in denominator. This indicates that diodes of minimal area have the highest cutoff frequencies. Because SiC diodes can be made smaller than Si or GaAs varactor diodes of equivalent power ratings, the cutoff frequency of the SiC device will have a much higher cutoff frequency. The significance of this characteristic is evident upon viewing FIG. 3 where the ratio of operating frequency to cutoff frequency ($f_{op}/f_{co}$) is plotted against multiplier efficiency. As can be seen, varactor diodes having higher cutoff frequencies have significantly higher efficiency levels than varactor diodes having lower cutoff frequencies.

Figure 4:
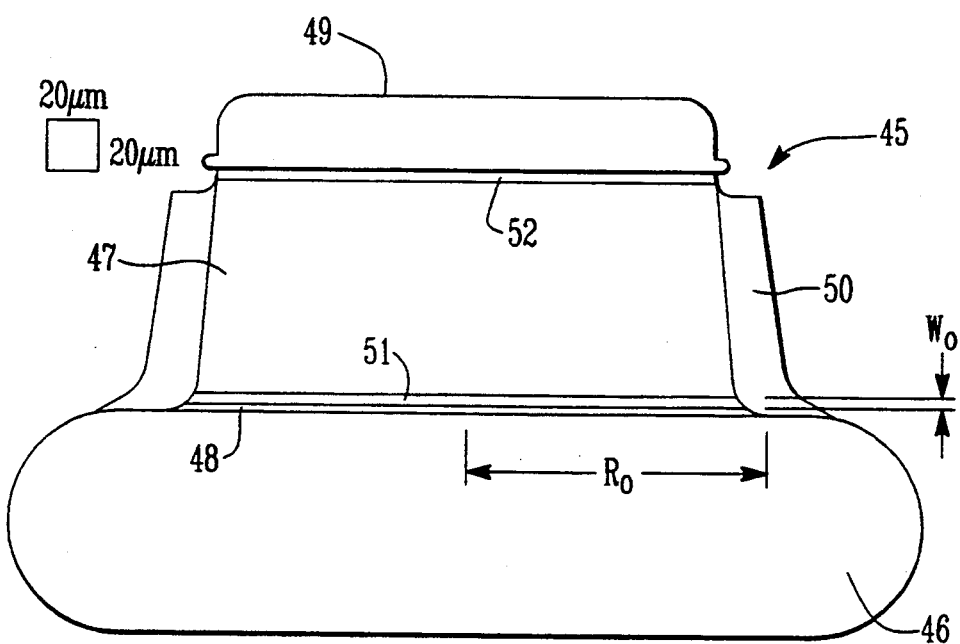
FIG. 4 is a diagrammatic representation of a silicon carbide varactor diode which may be utilized in frequency multiplier circuits of the invention (seen generally in elevation).

FIG. 4 illustrates a SiC varactor diode 45. Diode 45 may be fabricated using semiconductor fabrication techniques similar to those currently used for GaAs devices. The dimensional reference is provided to give an indication of typical dimensions which a practical realization of diode 45 may take. Heat sink 46, provided to dissipate heat generated in the junction region, also serves in this embodiment as a base upon which other diode components are situated. These other diode components include a SiC substrate 47 sandwiched between electrodes 48 and 49. Electrode 48 functions in this case as a noninjecting Schottky barrier contact, while electrode 49 functions as an ohmic contact. A passivation coating 50, which may be applied by spinning techniques, generally covers the circumference of substrate 47. In presently preferred embodiments, coating 50 is a polyamide material.

Substrate 47 includes several regions of doping to achieve the desired operating characteristics. Specifically, a first N-type region 51 is provided directly above contact 48 to form the diode junction. For best results, region 51 should preferably have a carrier concentration falling within the range of $5 \times 10^{14}$ to $5 \times 10^{17}$ per cubic centimeter. Preferably, the thickness, $W_o$, of region 51 should be approximately two (2) microns. A typical value, $R_o$, for the radius of contact 48 may be 100 micrometers. Assuming the face of contact 48 contiguous with region 51 to be to be round, this gives a very low junction area of approximately $3.1 \times 10^{-4}$ square centimeters.

Presently preferred embodiments have a specific carrier concentration of $6.0 \times 10^{16}$ cm$^{-3}$. A heavily doped N+ region 52 is provided directly below electrode 49 to lower the ohmic contact resistance. Generally, it is desirable to provide sufficient carriers in region 52 such that the resistivity is less than $2.0 \times 10^{-5}$ $\Omega$cm$^2$. The remainder of substrate 47 is also a relatively heavily doped N+ region though not so much as region 52. A resistivity within the remainder of substrate 47 less than $3.0 \times 10^{-2}$ $\Omega$cm$^{-2}$ is believed suitable.

In some applications, it may be desirable to utilize a full-wave varactor bridge network in lieu of the single varactor diodes shown in FIGS. 1 and 2. While adding some complexity to the overall circuit, such a bridge network offers the following significant advantages: (1) the input and output ports are balanced impedances; (2) the second and fourth harmonics of the fundamental are inherently cancelled at the input port, thus eliminating the need for tuning stubs to cancel these components; and (3) the fundamental and third harmonic are inherently cancelled at the output port, thus eliminating the need to filter these components. Eliminating filter elements does more than simplify the circuit, it eliminates elements which restrict bandwidth. Frequency multiplier circuits utilizing these principles are illustrated in FIGS. 5A and 5B.

Figure 5A:
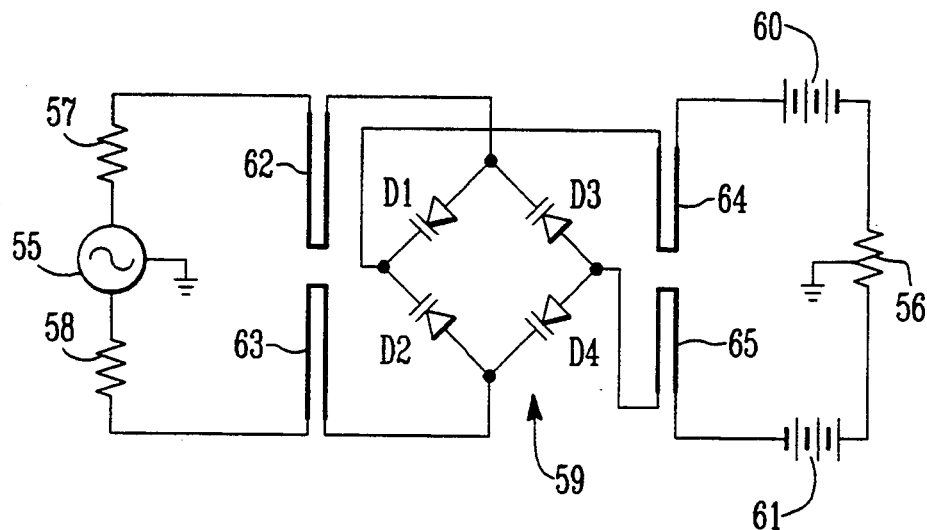
FIGS. 5A and 5B respectively illustrate embodiments of frequency multiplier circuits of the invention utilizing a four terminal varactor diode bride network.

Referring to FIG. 5A, a frequency multiplier circuit is provided to receive power at fundamental frequency from balanced source 55 and deliver power to balanced load 56 at the second harmonic thereof. Balanced source 55 includes source impedance, which is represented by resistors 57 and 58 serially connected along high and low input lines, respectively. Frequency multiplication is provided by full wave varactor diode bridge network 59 which includes diodes D1, D2, D3, D4 connected in each of its four legs. In this case, reverse bias of the diodes within network 59 is maintained by batteries 60 and 61 serially connected along high and low output lines, respectively. Batteries 60 and 61 should each have a DC voltage level approximately equal to one-half the necessary DC offset.

Input filtering is provided in the circuit 5A by shorted tuning stubs 62 and 63. Tuning stubs 62 and 63 serve to block the third harmonic by having an electrical length approximately equal to one-quarter the wavelength of that frequency component. As stated above, however, filtering of second and fourth harmonics is not necessary in the input due to the cancellation action of network 59. Similarly, tuning stubs 64 and 65, which have a length approximately equal to one quarter the wavelength of the fourth harmonic, block frequency components appearing across network 59 at that frequency. The characteristic impedances of tuning stubs 62, 63, 64, 65 are adjusted to provide cancellation of the capacitive reactance of network 59 in a similar manner to that described above with reference to FIG. 1.

Figure 5B:
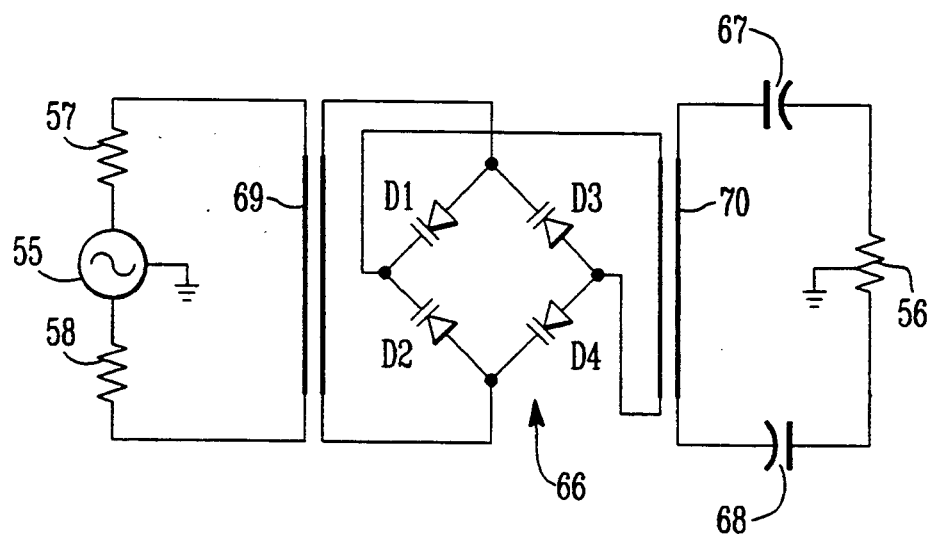

FIG. 5B illustrates a circuit similar to that shown in FIG. 5A. In this case, however, reverse bias of diodes within bridge network 66 is maintained by DC blocking capacitors 67 and 68 connected along the high and low lines, respectively, of the circuit output. In order to impose as little reactance on the overall circuit as possible, capacitors 67 and 68 should preferably have relatively large capacitance values. A capacitance of greater than 19 pico-farads is believed to be suitable for most anticipated applications. In this case, input filtering is provided by a single tuning stub 69. Tuning stub 69 is connected across the high and low lines of the circuit input and has an electrical length of approximately one-half the wavelength of the third harmonic. Similarly, tuning stub 70 has an electrical length approximately equal to one-half the wavelength of the fourth harmonic. As described above, the characteristic impedances of tuning stubs 69 and 70 are preferably adjusted to cancel capacitive reactance of the diodes within bridge network 66.

Figure 6:
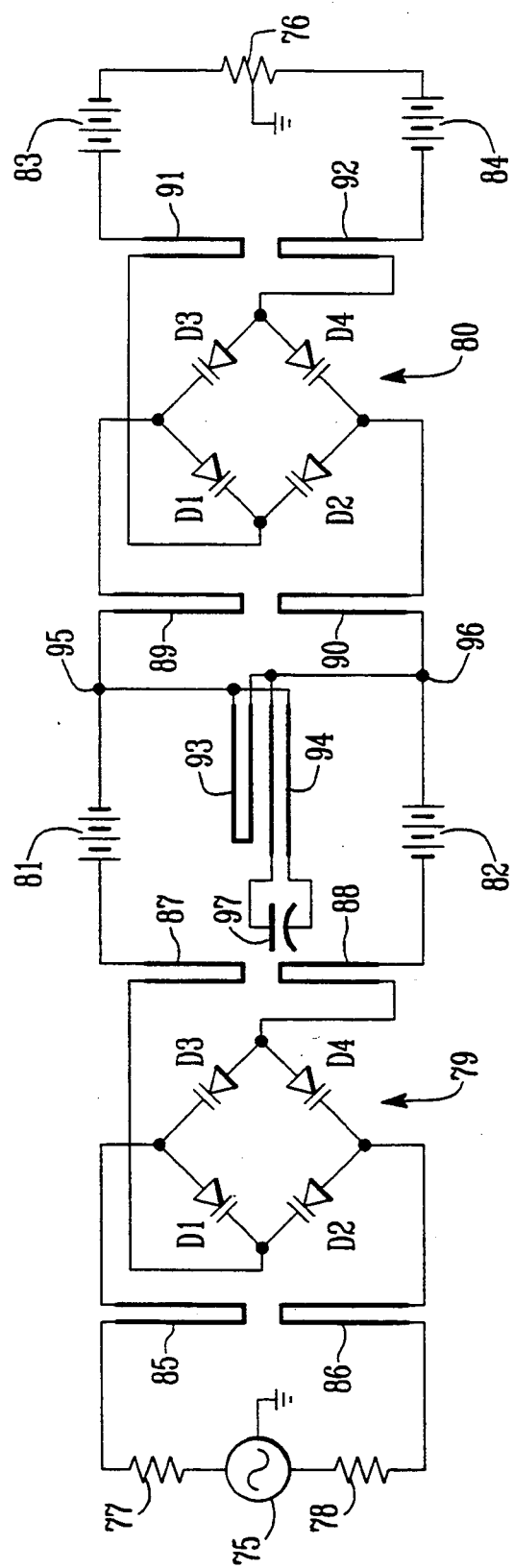
FIG. 6 illustrates a presently preferred embodiment of a frequency multiplier circuit of the invention in which two frequency multiplier stages are cascaded.

In many applications, it may be desirable to achieve higher frequency multiplication factors than could be effectively achieved with a single frequency multiplier stage. FIG. 6 illustrates such a circuit which includes a pair of frequency multiplier stages. The circuit receives power from balanced source 75 at fundamental frequency and delivers power to balanced load 76 at the fourth harmonic. The source impedance of balanced source 75 is represented by resistors 77 and 78. Each of the stages respectively includes, in this case, a varactor diode bridge network referenced as 79 and 80, respectively. Reverse bias on the diodes within bridge network 79 is here provided by batteries 81 and 82. Similarly, reverse bias is maintained on the diodes within bridge network 80 by batteries 83 and 84.

Tuning stubs 85 and 86 block passage of third harmonic components from bridge network 79 back to the circuit input. Similarly, tuning stubs 87 and 88 block fourth harmonic components produced by bridge network 79 from passing to the next stage. Passage of six harmonic components produced by bridge network 80 back toward the circuit input is similarly prevented by tuning stubs 89 and 90. Tuning stubs 91 and 92 are placed in the circuit output to block passage of power at the eighth harmonic of the fundamental.

To improve circuit bandwidth, the characteristic impedance of all of tuning stubs 85 through 92 are adjusted as described above to cancel the capacitive reactance imposed on the circuit by the diodes within bridge networks 79 and 80. Such measures generally facilitate the achievement of relatively wide bandwidth when a single multiplier state is utilized. Despite these measures, it has been found in circuit simulations that circuit response may degrade to a relatively narrow band when multiplier stages are cascaded.

Fortunately, an effective solution to this problem is possible. Particularly, a tuning network placed at the juncture of two stages mitigates the degradation in bandwidth which would otherwise occur when two stages are connected. This tuning network may include a single tuning stub, but a more effective solution is believed to be that which is shown in FIG. 6. Here, a pair of parallel tuning stubs 93 and 94 are illustrated connected across nodal connections 95 and 96. Tuning stub 93 may be a quarter wavelength shorted stub resonant at the second harmonic of the fundamental frequency. As such, it is seen as an open circuit by power components at this frequency. Tuning stub 93 is seen as a short to fourth harmonic components, as desired. Tuning stub 93, however, does not provide desired low impedance at the sixth harmonic of the fundamental. Thus, components at this frequency would otherwise be allowed to pass to the juncture interconnecting the two frequency multiplier stages. However, by terminating stub 94 with a capacitor, it is possible to adjust its length and capacitance such that its impedance is high at the second harmonic but low at the sixth harmonic of the fundamental. Connecting stubs 93 and 94 in parallel therefor produces an impedance having the desired high value at the second harmonic and nulls at both the fourth and sixth harmonics.

Computer simulations of the circuit shown in FIG. 6 were performed utilizing PSPICE circuit analysis software on a suitable personal computer. Simulations were conducted for the case of ideal, lossless tuning stubs, as well as under fairly pessimistic assumptions as to the potential tuning stub losses. Each of these cases assume conservative values of less than 200 V for the maximum reverse breakdown voltage of the varactor diodes. The circuit parameters are presented in the table below:

TABLE I
CIRCUIT PARAMETERS

| | |
|---|---|
| DIODES WITHIN NETWORK 79: | $C = \dfrac{32.5 \text{ pf}}{\sqrt{[1 - V/3}}$ |
| | $R_s = 0.07077 \, \Omega$ |
| | $V_{MAX} = 188 \text{ V}$ |
| SOURCE 75: | $V = 30.984 \, V_{RMS}$ |
| | $f = 2.5 \text{ GHz}$ |
| RESISTORS 77, 78: | $R = 0.60 \, \Omega$ |
| TUNING STUBS 85, 86: | $Z_0 = 7.55 \, \Omega$ |
| | Length = 33.333 ps |
| TUNING STUBS 87, 88: | $Z_0 = 2.16 \, \Omega$ |
| | Length = 25 ps |
| BATTERIES 81, 82: | 70 VDC |
| TUNING STUB 93: | $Z_0 = 1.0 \, \Omega$ |
| | Length = 50 ps |
| TUNING STUB 94: | $Z_0 = 1.0 \, \Omega$ |
| | LENGTH = 88.966 ps |
| CAPACITOR 97: | $c = 47.1 \text{ pf}$ |
| TUNING STUBS 89, 90: | $Z_0 = 7.35 \, \Omega$ |
| | LENGTH = 16.667 ps |
| DIODES WITHIN NETWORK 80: | $C = \dfrac{16.2 \text{ pf}}{\sqrt{1 - V/3}}$ |
| | $R_s = 0.1420 \, \Omega$ |
| | $V_{MAX} = 175 \text{ V}$ |
| TUNING STUBS 91, 92 | $Z_0 = 2.14 \, \Omega$ |
| | Length = 12.5 ps |
| BATTERIES 83, 84: | 65 VDC |
| LOAD 76: | $1.2 \, \Omega$ |
| | $f = 10 \text{ GHz}$ |

In the lossless case, this circuit produced output power of 140.6 watts at 10 GHz based on a 200 watt input at 2.5 Ghz. Thus, in the lossless case, the simulated circuit achieved a relatively high efficiency of 70.3%. Significantly, the calculated bandwidth of the circuit is −10.7% to +8.5% of center band, which is a very desirable figure.

Figure 7:
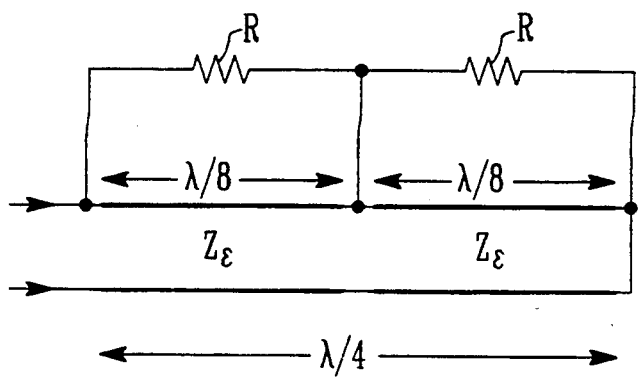
FIG. 7 is a schematic representation of a model which may be used to simulate losses in tuning stub filters utilized in the invention.

The circuit analysis software which was utilized to perform the above simulation does not directly account for losses in the tuning stubs. Therefore, in an effort to add the next level of realism, it was necessary to devise a model having losses approximating a lossy transmission line. FIG. 7 illustrates the model which was utilized for this purpose. This model simulates realistic characteristics over a range of frequencies which is limited for computational efficiency but of sufficient bandwidth for a degree of realism.

The basic intent of this model is produce a one-quarter wave length tuning stub which has a quality factor ("Q") of about fifty (50) at a frequency of 10 GHz. This quality factor is one which is considered realistic, and therefore is adopted as a design characteristic in spite of the fact that the Q will actually be dependent on the stubs characteristic impedance and dielectric parameters. Another characteristic of the simulated lossy tuning stub is that its attenuation increases as approximately the square root of the frequency.

Equation (16) is a mathematical relationship relating the Q of quarter wave length stub to the attenuation of a transmission line.

$$\alpha = \frac{27.3}{Q_o \lambda_m} \, dB/cm \tag{16}$$

where:

$\alpha$ = attenuation of lossy transmission line
$Q_o$ = Q of quarter wavelength stub
$\lambda_m$ = resonant wavelength within the material The derivation of this equation can be found in the following work: K. C. Gupta, Ramesh Garg and I. J. Bahl, *Microstrip Lines and Slot Lines*, p.35 (Artech House Inc. 1979). This equation is useful in the present application to convert from the commonly available attenuation factors to the quarter wavelength Q needed for this simulation.

Figure 8:
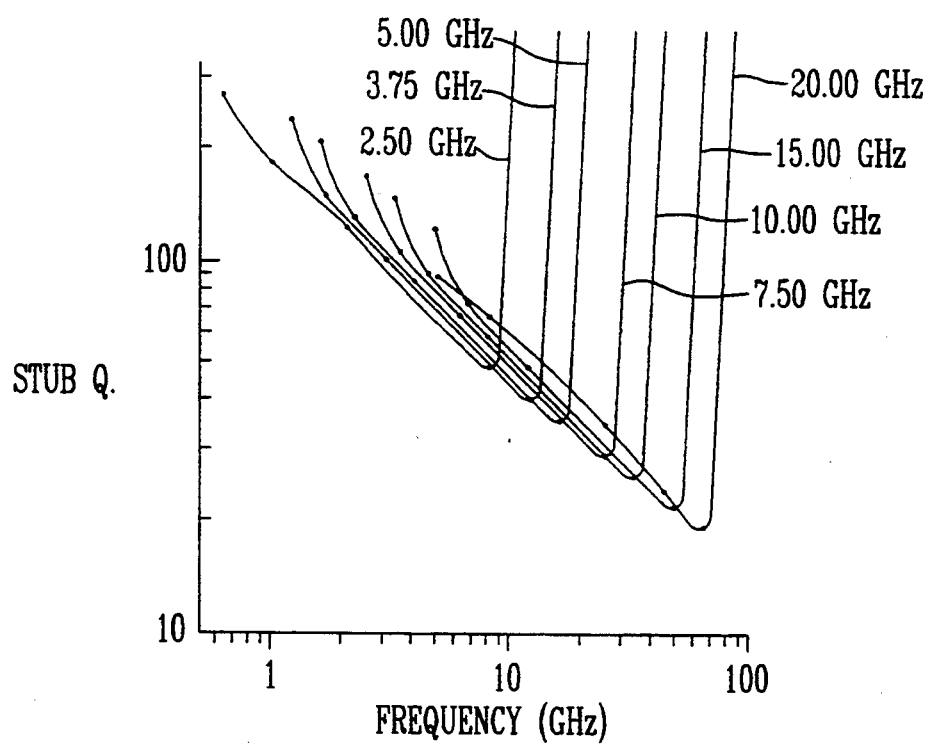
FIG. 8 is a plot of tuning stub quality factor (Q) versus frequency for the simulated tuning stub of FIG. 7.

FIG. 8 illustrates the Q of the simulated lossy stubs as a function of frequency. In spite of the rather simple line equivalent structures, they produce excellent simulations up to the third harmonic and down to the third subharmonic of their resonant frequencies. No attempt is made to extend this range since signal components beyond this range are negligible. The resistance values needed to achieve the proper loss in a series of transmission line stubs ($Z_o=100$) are presented below in Table II.

TABLE II

| LOSSY STUB SIMULATION RESISTANCES | |
|---|---|
| FREQUENCY (GHz) | RESISTANCE, R |
| 2.50 | 7420 |
| 3.75 | 6058 |
| 5.00 | 5247 |
| 7.50 | 4284 |
| 10.00 | 3710 |
| 15.00 | 3029 |
| 20.00 | 2623 |

For other transmission line stubs the loss resistances are directly proportional to the characteristic impedance of the line.

When these loss parameters are added to the simulated circuit, an output power of 104.148 Watts is achieved. This 52.07% efficiency is lower than the ideal case, but is still significantly better than that which could generally be achieved according to the teachings of the prior art. The bandwidth of the circuit remains high, having a range of −10.5% to plus 8.0% of center band frequency.

Figure 9:
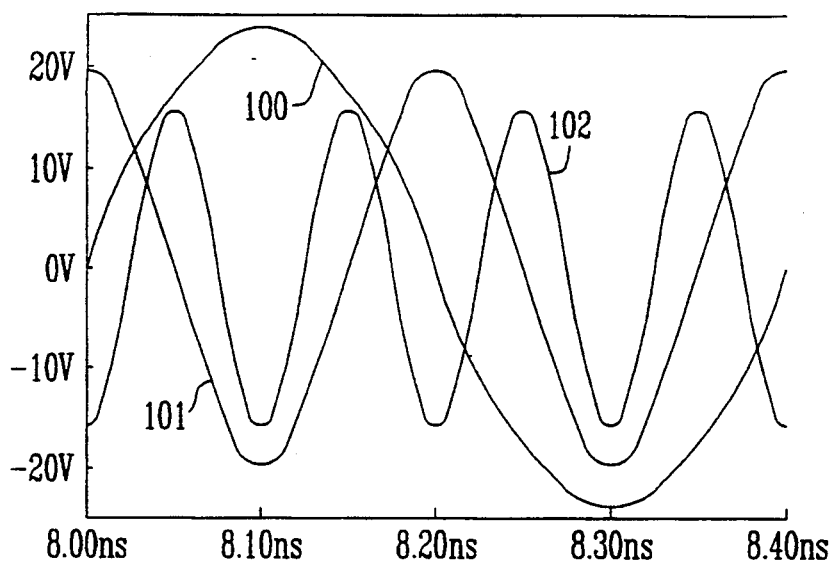
FIG. 9 is a computer simulated plot of various voltage waveforms produced by the circuit of FIG. 6.

FIG. 9 illustrates the voltage waveforms produced by the circuit of FIG. 6 in the computer simulation wherein lossy tuning stubs are assumed. The input voltage produced by source 75, after accounting for voltage drop across the source resistors 77 and 78, is referenced by plot 100. The second harmonic signal produced across nodal connections 95 and 96 is similarly represented by plot 101. Finally, the fourth harmonic output voltage applied to load 76 is represented by plot 102.

Figure 10:
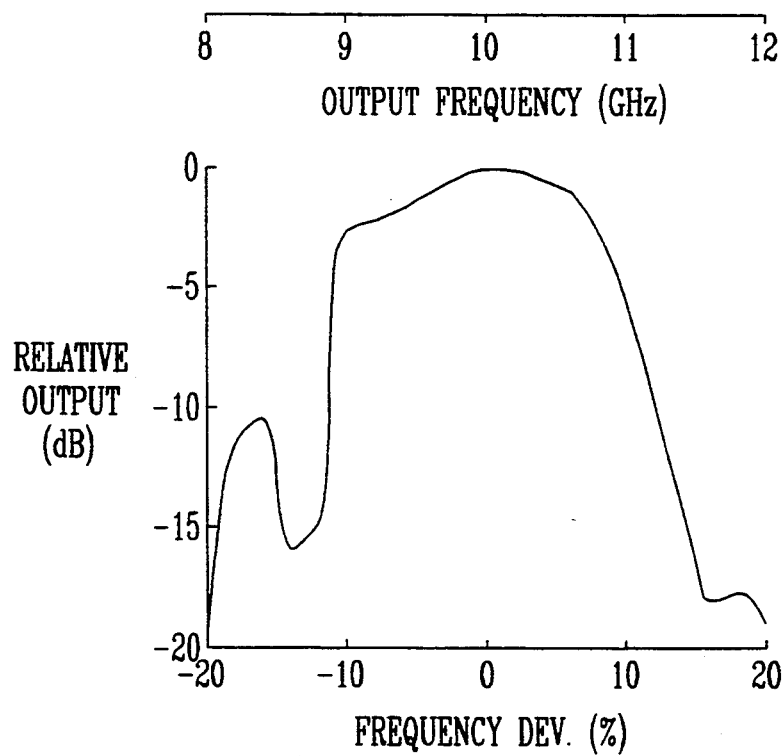
FIG. 10 is a computer simulated plot of the bandwidth of the circuit of FIG. 6.

A major feature of the frequency multiplier circuits disclosed herein are their wideband frequency response. The wideband response permits use of the circuitry of the invention in high performance systems requiring a degree of frequency agility. Additionally, increased tolerance to undesired component variance is facilitated. FIG. 10 is the result of multiple response simulations at various frequencies of the circuit of FIG. 6 (in the case in which lossy tuning stubs are assumed). The response curve indicates that the response is relatively flat over a substantial bandwidth and then drops abruptly at the band edges. The change from ideal tuning stubs to lossy tuning stubs has resulted in a negligible change in bandwidth. At the band edges, there are some side lobes apparently resulting from interaction of harmonic resonances of the various tuning stubs.

The relationship between input drive and output power is nonlinear, basically because the frequency conversion is based on the nonlinear voltage control capacitance of the varactor diodes. It was, however, determined in simulations that operation of the varactor diodes in a fixed bias mode offers greater linearity than self biased embodiments. This is due to the fact that the operating point of the varactor diodes will change with input drive level in the self biased case. Thus, the tuning of the multiplier circuit is somewhat dependent on drive level. In the case of a fixed bias varactor diode, tuning remains more nearly constant.

The simulations discussed herein have involved relatively low impedance levels. In practice, the impedance levels of the tuning stubs involve line dimensions where the widths are a significant fraction of the line lengths. Modification of the circuit parameters to accommodate greater transmission line impedances can be achieved by appropriate scaling. This conversion may be accomplished by replacing each diode position by N diode junctions in series. When this is done, all of the impedance values given are multiplied by the factor $N^2$. The voltage level of the bias batteries and the source are then multiplied by N. For cases in which N is approximately 4 or 5, very reasonable impedance levels can be provided.

It can thus be seen that the invention provides frequency multiplier circuitry offering many advantages when compared with the prior art. Among these are greater bandwidth, higher efficiency and greater power capacity. It may be possible to achieve even higher efficiency levels in the overall system incorporating the circuitry of the invention by cascading several additional frequency multiplier stages at the "front end." This is because the losses of a multiplier chain are concentrated in the highest frequency range. Therefore, any modest increase in multiplier loss by additional stages at the input could easily be overcome by allowing amplifier operation at substantially lower frequencies where transistors could be operated in the class E mode.

While presently preferred embodiments of the invention have been shown and described, it is to be distinctly understood that the invention is not limited thereto but may be otherwise variously embodied within the scope of the following claims.

We claim:

1. A high power frequency multiplier circuit electrically connectable interposing an electrical energy source and an electrical load to be driven by said electrical energy source to deliver an output signal at a preselected harmonic of an input signal produced by said electrical energy source, said frequency multiplier circuit comprising:
   silicon carbide varactor means for providing a nonlinear voltage dependent capacitance to produce a voltage thereacross having a component at said harmonic frequency;
   an input filter electrically connected interposing an input of said high power frequency multiplier circuit and said silicon carbide varactor means;
   an output filter electrically connected interposing an output of said high power frequency multiplier circuit and said silicon carbide varactor means;
   said input filter and said output filter each having at least one tuning stub of a length as necessary to provide a high impedance to undesired harmonics; and
   bias means for maintaining reverse bias on said silicon carbide varactor means.

2. The frequency multiplier of claim 1 wherein said at least one tuning stub of said input filter and said at least one tuning stub of said output filter generally have a selected characteristic impedance to provide impedance matching between said silicon carbide varactor means and said input and said output of said frequency multiplier circuit, respectively.

3. The frequency multiplier circuit of claim 1 wherein said silicon carbide varactor means comprises a plurality of silicon carbide varactor diodes arranged in a four terminal bridge network.

4. The frequency multiplier circuit of claim 3 wherein said input filter and said output filter include only tuning stubs having a first impedance peak at a third harmonic and a fourth harmonic of said input signal, respectively.

5. The frequency multiplier of claim 4 wherein said at least one tuning stub of said input filter and at least one tuning stub of said output filter each generally have a selected characteristic impedance to provide impedance matching between said silicon carbide varactor means and said input and said output of said frequency multiplier circuit, respectively.

6. The frequency multiplier circuit of claim 1 wherein said bias means comprises first and second direct current blocking capacitors serially connected between said silicon carbide varactor means and said output of said frequency multiplier circuit.

7. The frequency multiplier circuit of claim 6 wherein said first and second blocking capacitors each have a capacitance generally greater than 19 pico-farads.

8. The frequency multiplier circuit of claim 1 wherein said bias means comprises first and second DC voltage sources serially connected between said silicon carbide varactor means and said output of said frequency multiplier circuit.

9. The frequency multiplier circuit of claim 8 wherein said first DC voltage source and said second DC voltage source each have a DC voltage level approximately equal to one-half a DC offset in a varactor signal across said varactor means.

10. A frequency multiplier circuit electrically connectable interposing an electrical energy source and an electrical load to be driven by said electrical energy source to deliver an output signal at a selected harmonic of an input signal produced by said electrical energy source, said frequency multiplier circuit comprising:
    at least two cascaded frequency multiplier stages, an output of a first of said at least two cascaded frequency multiplier stages being electrically connected to an input of a second of said at least two cascaded frequency multiplier sections;
    each of said at least two multiplier stages including:
    (a) a plurality of varactor diodes arranged in a four terminal bridge network;
    (b) an input filter electrically connected interposing an input of said frequency multiplier stage and said bridge network;
    (c) an output filter electrically connected interposing an output of said frequency multiplier stage and said bridge network;
    (d) said input filter and said output filter each having at least one tuning stub of a length as necessary to provide a high impedance to undesired harmonics of said input signal, said at least one tuning stub of said input filter and said at least one tuning stub of said output filter each generally having a selected characteristic impedance to provide impedance matching between said bridge network and said input and said output of said frequency multiplier circuit, respectively; and
    (e) bias means for maintaining reverse bias on said bridge network; and
    a tuning network electrically connected across the nodal connection points between respective ones of said at least two frequency multiplier sections, said tuning network including at least one tuning stub configured to pass an intermediary multiple of said input signal for use as a second stage input signal, said tuning network providing a low impedance path for other undesired multiples of said input signal.

11. The frequency multiplier circuit of claim 10 wherein said tuning network includes a shorted tuning stub having a length approximately equal to one-fourth wave length of said intermediary multiple.

12. The frequency multiplier circuit of claim 10 wherein said tuning network comprises a pair of parallel-connected tuning stubs, a first of said pair of parallel-connected tuning stubs having a low impedance peak at a frequency four times a frequency of said input signal, a second of said pair of parallel-connected tuning stubs having a low impedance at a frequency six times said frequency of said input signal.

* * * * *